(12) United States Patent
Taniguchi et al.

(10) Patent No.: US 12,080,612 B2
(45) Date of Patent: Sep. 3, 2024

(54) SEMICONDUCTOR DEVICE HAVING AN INSULATING SHEET AND A CONDUCTIVE FILM, AND METHOD OF MANUFACTURING THE SAME

(71) Applicant: FUJI ELECTRIC CO., LTD., Kawasaki (JP)

(72) Inventors: Katsumi Taniguchi, Matsumoto (JP); Yoshinari Ikeda, Matsumoto (JP); Ryoichi Kato, Matsumoto (JP); Yuma Murata, Matsumoto (JP); Akito Nakagome, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/894,645

(22) Filed: Aug. 24, 2022

(65) Prior Publication Data

US 2023/0119240 A1  Apr. 20, 2023

(30) Foreign Application Priority Data

Oct. 20, 2021  (JP) .................................. 2021-171322

(51) Int. Cl.
*H01L 23/047*  (2006.01)
*H01L 21/48*  (2006.01)
(Continued)

(52) U.S. Cl.
CPC ........ *H01L 23/047* (2013.01); *H01L 21/4807* (2013.01); *H01L 21/4817* (2013.01); *H01L 23/3731* (2013.01); *H01L 25/072* (2013.01)

(58) Field of Classification Search
CPC ............... H01L 23/047; H01L 21/4807; H01L 21/4817; H01L 23/3731; H01L 25/072; H01L 23/057; H01L 23/08; H01L 23/24; H01L 23/49811; H01L 23/3735; H01L 24/42; H01L 2224/0603; H01L 2224/40225; H01L 2224/49113; H02M 1/0054; H02M 7/003
(Continued)

(56) References Cited

U.S. PATENT DOCUMENTS 4,827,376 A *  5/1989  Voss ........................ H01L 23/42
257/E23.09
10,147,707 B2  12/2018  Tonedachi
(Continued)

FOREIGN PATENT DOCUMENTS

JP    2006-210500 A    8/2006
JP    2016-144377 A    8/2016
(Continued)

*Primary Examiner* — Duy T Nguyen

(57) ABSTRACT

A semiconductor device includes: an insulated circuit substrate; a power semiconductor element mounted on the insulated circuit substrate; a first terminal having a plate-like shape having a first main surface and electrically connected to the power semiconductor element; a second terminal having a second main surface opposed to the first main surface of the first terminal and electrically connected to the power semiconductor element; an insulating sheet interposed between the first main surface and the second main surface; and a conductive film provided on at least one of the first main surface side and the second main surface side of the insulating sheet.

7 Claims, 6 Drawing Sheets

(51) Int. Cl.
  *H01L 23/373*  (2006.01)
  *H01L 25/07*  (2006.01)
(58) Field of Classification Search
  USPC .......................................................... 257/695
  See application file for complete search history.

(56) References Cited

U.S. PATENT DOCUMENTS

| | | | |
|---|---|---|---|
| 10,861,833 | B2 | 12/2020 | Tonedachi |
| 11,410,922 | B2 | 8/2022 | Kato et al. |
| 2002/0167062 | A1* | 11/2002 | Narita ................ H01L 31/0203 |
| | | | 257/E31.117 |
| 2008/0284033 | A1* | 11/2008 | Horio ...................... H01L 24/29 |
| | | | 257/762 |
| 2015/0243640 | A1* | 8/2015 | Horio ................ H01L 23/3735 |
| | | | 257/701 |
| 2016/0379912 | A1* | 12/2016 | Komatsu ............ H01L 23/3737 |
| | | | 257/707 |
| 2018/0076053 | A1* | 3/2018 | Karasawa ............... H01L 23/16 |
| 2018/0240732 | A1* | 8/2018 | Tonedachi .............. H01L 24/48 |
| 2019/0051636 | A1 | 2/2019 | Tonedachi |
| 2020/0126947 | A1* | 4/2020 | Karasawa ............ H01L 25/162 |
| 2021/0202372 | A1 | 7/2021 | Kato et al. |

FOREIGN PATENT DOCUMENTS

| | | |
|---|---|---|
| JP | 2018-137283 A | 8/2018 |
| JP | 2021-106235 A | 7/2021 |

\* cited by examiner

SEMICONDUCTOR DEVICE HAVING AN INSULATING SHEET AND A CONDUCTIVE FILM, AND METHOD OF MANUFACTURING THE SAME

CROSS-REFERENCE TO RELATED APPLICATION

This application claims benefit of priority under 35 USC 119 based on Japanese Patent Application No. 2021-171322 filed on Oct. 20, 2021, the entire contents of which are incorporated by reference herein.

BACKGROUND OF THE INVENTION

1. Field of the Invention

The present invention relates to a semiconductor device (a power semiconductor module) equipped with power semiconductor elements and a method of manufacturing the same, and more particularly, to a wiring structure of terminals connected to an external electrode supply device or a direct current power wire or the like of the power semiconductor module.

2. Description of the Related Art

The demand for developing battery-powered vehicles such as electric vehicles and electric rail vehicles has grown rapidly because of worldwide trends toward decarbonization. Battery-powered vehicles need to exhibit efficient motor control by a power conversion device such as an inverter or a converter, which is typically equipped with a power semiconductor module. A power semiconductor module converts DC power to AC power or converts AC power to DC power. The power semiconductor module includes a plurality of power semiconductor elements such as an insulated gate bipolar transistor (IGBT), a metal-oxide-semiconductor field-effect transistor (MOSFET), and a diode. The power conversion is executed upon switching such that the power semiconductor elements are turned on and off.

The power semiconductor elements execute the switching at high speed as much as possible so as to reduce switching loss caused during the switching, while overvoltage may be caused due to the high-speed switching. The cause of the overvoltage would not only increase the loss but also cause damage to the power semiconductor module. A reduction in inductance to reduce wiring parasitic inductance is typically effective to reduce the overvoltage during the high-speed switching. The reduction in inductance can be achieved by a 2-in-1 module having a laminated wiring structure including a positive electrode terminal and a negative electrode terminal stacked on one another so as to lead current to flow through the positive electrode terminal and the negative electrode terminal in the opposite directions via an insulator, in which switching elements such as an IGBT or a MOSFET are connected in series, the positive electrode terminal and the negative electrode terminal are connected to both ends of the switching elements connected in series, and AC output terminals are connected between the respective switching elements (refer to JP 2018-137283 A, JP 2016-144377 A, JP 2006-210500 A, and JP 2021-106235 A).

JP2018-137283 A discloses a power semiconductor module in which a positive electrode terminal and a negative electrode terminal are configured to be wired via an insulator so as to be laminated in the power semiconductor module. An external terminal is, however, connected by bolt wiring to an external power supply device or a DC power wire and is thus not laminated, which reduces an effect of reducing the inductance.

JP 2016-144377 A discloses a power semiconductor module having a structure in which a positive electrode terminal and a negative electrode terminal on the outside of the power semiconductor module are laminated together. The terminals of the power semiconductor module are subjected to bending because the lamination wiring is executed further to the outside of the power semiconductor module. Setting a distance between the positive electrode terminal and the negative electrode terminal to a particular value is quite important in order to reduce wiring inductance of the respective terminals, which requires a regulation by a unit of 0.1 millimeters. The respective terminals are thus required to be subjected to the bending processing with a high accuracy, leading to an increase in cost accordingly.

JP 2016-144377 A discloses a method of bonding a positive electrode terminal and a negative electrode terminal by use of epoxy resin or a polyimide-based adhesive as an insulator between the terminals, or a method of bonding the respective terminals with an adhesive after subjecting the terminals to insulation coating by electrodeposition coating. These methods, however, easily cause bubbles at a bent part that remain as voids after solidification of the adhesive, which may cause partial discharge. The partial discharge could deteriorate the insulating material to lead to a short circuit between the respective terminals.

JP2016-144377 A also discloses a method of filling a gap between the positive electrode terminal and the negative electrode terminal with insertion resin by insertion molding with a metal die. This insertion molding needs to ensure a distance to some extent between the respective terminals, since insufficient filling with the insertion resin may be caused if the distance is too short, and the insufficiently-filled parts result in voids. The insertion molding needs to keep a gap of typically 1.5 millimeters or greater, which would vary depending on the area between the terminals or the type of the insertion resin, without causing the insufficient filling. This method cannot ensure a sufficient effect of reducing the inductance.

JP2016-144377 A further discloses a method of bonding the respective terminals together by use of a flexible adhesive sheet having insulating properties. However, the outside of the bent part tends to expand while the inside of the bent part tends to contract, since the bent part has different expansion and contraction properties between the inside and the outside. This easily causes wrinkles in the sheet on the inside, and may causes voids accordingly.

SUMMARY OF THE INVENTION

In view of the foregoing problems, the present invention provides a semiconductor device with a structure having high reliability and capable of reducing a switching loss, and a method of manufacturing the same.

An aspect of the present invention provides a semiconductor device including: an insulated circuit substrate; a power semiconductor element mounted on the insulated circuit substrate; a first terminal having a plate-like shape having a first main surface and electrically connected to the power semiconductor element; a second terminal having a second main surface opposed to the first main surface of the first terminal and electrically connected to the power semiconductor element; an insulating sheet interposed between the first main surface and the second main surface; and a conductive film provided on at least one of the first main surface side and the second main surface side of the insulating sheet.

Another aspect of the present invention provides a method of manufacturing a semiconductor device, the method including: mounting a power semiconductor element on an insulated circuit substrate; forming a conductive film on at least either a first main surface or a second main surface of an insulating sheet; and interposing the first main surface and the second main surface of the insulating sheet provided with the conductive film between a first terminal and a second terminal each having a plate-like shape so as to be integrated with a case.

DETAILED DESCRIPTION

Figure 1:
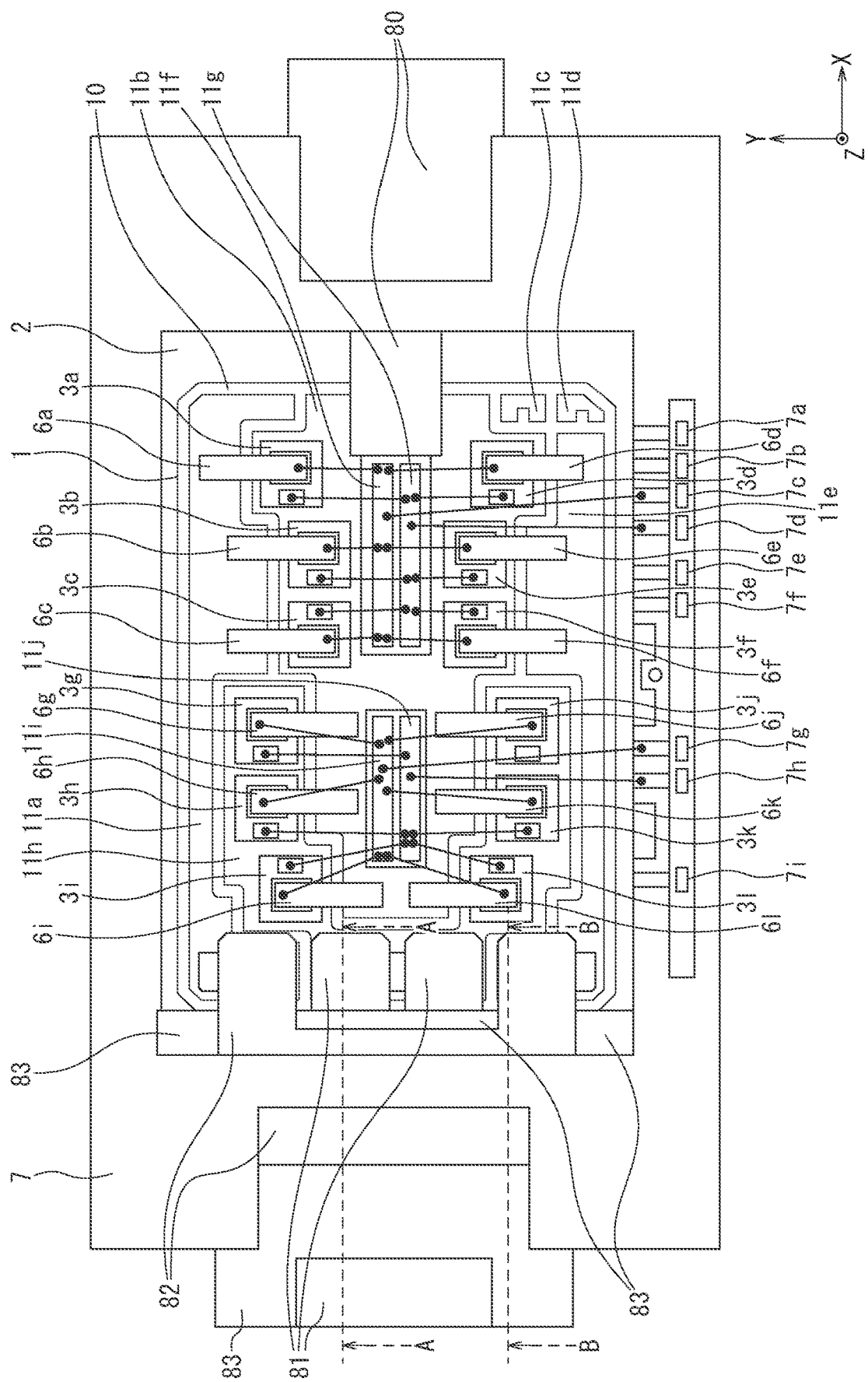
FIG. 1 is a plan view illustrating a semiconductor device according to an embodiment of the present invention.

With reference to the Drawings, an embodiment of the present invention will be described below.

In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description.

Moreover, in some drawings, portions are illustrated with different dimensional relationships and proportions.

The terms regarding the directions such as "upper", "lower", "upper-lower", "left", "right", and "right-left" as described herein are definitions made only for illustration purposes, and it should be understood that these terms are not intended to limit the technical idea of the present invention. For example, the "upper-lower" direction of an element can be oriented in the "right-left" direction when the element is turned over 90 degrees, and can be oriented on the opposite sides when turned over 180 degrees. In addition, the terms "top surface" and "bottom surface" can also be referred to as "front surface" and "rear surface" respectively.

In the Specification, an element "first terminal" is referred to as either a positive electrode terminal or a negative electrode terminal of a power semiconductor module, and an element "second terminal" is referred to as the other one of the positive electrode terminal and the negative electrode terminal of the power semiconductor module different from the "first terminal". When the "first terminal" is the positive electrode terminal of the power semiconductor module, the "second terminal" is the negative electrode terminal of the power semiconductor module. When the "first terminal" is the negative electrode terminal of the power semiconductor module, the "second terminal" is the positive electrode terminal of the power semiconductor module.

<Structure of Semiconductor Device>

A semiconductor device (a power semiconductor module) according to an embodiment includes an insulated circuit substrate 1, a plurality of power semiconductor elements (semiconductor chips) 3a to 3l mounted on the insulated circuit substrate 1, and a case 7 arranged to surround the insulated circuit substrate 1 and the respective power semiconductor elements 3a to 3l, as illustrated in FIG. 1. FIG. 1 omits the illustration of a sealing material provided inside the case 7 to seal the power semiconductor elements 3a to 3l and the like. FIG. 1 schematically indicates, by the black dots, connection points of bonding wires connected to the power semiconductor element 3a to 3l and the like.

As illustrated in FIG. 1, the longitudinal direction of the semiconductor device according to the embodiment is defined as an X-axis, and the right direction in FIG. 1 is defined as a positive direction of the X-axis in the planar view of the semiconductor device according to the embodiment. The short-side direction of the semiconductor device according to the embodiment perpendicular to the X-axis is defined as a Y-axis, and the upper direction in FIG. 1 is defined as a positive direction of the Y-axis. The direction perpendicular to the X-axis and the Y-axis is defined as a Z-axis, and the front side in FIG. 1 is defined as a positive direction of the Z-axis. The same are applied to the definitions in FIG. 2.

FIG. 1 illustrates a 2-in-1 power semiconductor module in which two sets of six MOSFETs arranged in parallel are connected in series so as to serve as the respective power semiconductor elements 3a to 3l. A set of the power semiconductor elements 3a to 3f implements an upper arm for one phase of a three-phase inverter circuit, and a set of the power semiconductor elements 3g to 3l implements a lower arm. The semiconductor device according to the embodiment is not limited to the 2-in-1 power semiconductor module but is only required to be a power semiconductor module including a positive electrode terminal 81 and a negative electrode terminal 82, and may be a 1-in-1 or 6-in-1 semiconductor module, for example.

The respective power semiconductor elements 3a to 3l include a semiconductor substrate, a first main electrode (a drain electrode) arranged on the bottom surface side of the semiconductor substrate, and a second main electrode (a source electrode) and a control electrode (a gate electrode) arranged on the top surface side of the semiconductor substrate. The semiconductor substrate is made from silicon (Si), silicon carbide (SiC), gallium nitride (GaN), or gallium oxide ($Ga_2O_3$), for example. The arranged positions and the number of the power semiconductor elements 3a to 3l can be determined as appropriate. The respective power semiconductor elements 3a to 3l may be a field-effect transistor (FET) such as a MOSFET, or alternatively, an insulated gate bipolar transistor (IGBT), a static induction (SI) thyristor, or a gate turn-off (GTO) thyristor, for example.

The insulated circuit substrate 1 is a direct copper bonded (DCB) substrate or an active metal brazed (AMB) substrate, for example. The insulated circuit substrate 1 includes an insulating substrate 10, conductor foils (upper-side conductor foils) 11a to 11j arranged on the top surface side of the insulating substrate 10, and a conductor foil (a lower-side conductor foil) 12 (refer to FIG. 2 and FIG. 3) arranged on the bottom surface side of the insulating substrate 10. The insulating substrate 10 is a ceramic plate mainly including aluminum oxide ($Al_2O_3$), aluminum nitride (AlN), silicon nitride ($Si_3N_4$), or boron nitride (BN), or a resin insulating layer using polymer material, for example. The lower-side conductor foil 12 is not necessarily provided on the bottom surface side of the insulating substrate 10 when a resin insulating layer is used as the insulating substrate 10. The respective upper-side conductor foils 11a to 11j and the lower-side conductor foil 12 are made from copper (Cu) or aluminum (Al), for example. The respective upper-side conductor foils 11a to 11j are formed into an optional circuit pattern.

As illustrated in FIG. 1, the respective power semiconductor elements 3a to 3f are bonded onto the upper-side conductor foil 11b of the insulated circuit substrate 1 via bonding material such as solder or sintered material. The respective power semiconductor elements 3g to 3l are bonded onto the upper-side conductor foil 11h of the insulated circuit substrate 1 via bonding material such as solder or sintered material.

The case 7 is arranged to surround the respective circumferences of the power semiconductor elements 3a to 3f and the insulated circuit substrate 1. The case 7 can be made from resin material such as polyphenylene sulfide (PPS), polybutylene terephthalate (PBT), polybutylene succinate (PBS), epoxy, and phenol.

The case 7 is provided with control terminals 7a to 7i. The control terminal 7c is connected to the upper-side conductor foil 11f via a bonding wire. The upper-side conductor foil 11f is electrically connected to the source electrode of the respective power semiconductor elements 3a to 3f via bonding wires. The control terminal 7c detects current flowing through the respective source electrodes of the power semiconductor elements 3a to 3f.

The control terminal 7d is connected to the upper-side conductor foil 11g via a bonding wire. The upper-side conductor foil 11g is electrically connected to the gate electrode of the respective power semiconductor elements 3a to 3f via bonding wires. The control terminal 7d applies a control signal to the gate electrode of each of the power semiconductor element 3a to 3f.

The control terminal 7g is connected to the upper-side conductor foil 11i via a bonding wire. The upper-side conductor foil 11i is electrically connected to the source electrode of the respective power semiconductor elements 3g to 3l via bonding wires. The control terminal 7g detects current flowing through the respective source electrodes of the power semiconductor elements 3g to 3l.

The control terminal 7h is connected to the upper-side conductor foil 11j via a bonding wire. The upper-side conductor foil 11j is electrically connected to the gate electrode of the respective power semiconductor elements 3g to 3l via bonding wires. The control terminal 7h applies a control signal to the gate electrode of each of the power semiconductor element 3g to 3l.

The case 7 is provided with an output terminal 80, and the positive electrode terminal 81 and the negative electrode terminal 82 arranged to be opposed to the output terminal 80. The output terminal 80 is connected to the upper-side conductor foil 11b. The upper-side conductor foil 11b is electrically connected to the drain electrode of the respective power semiconductor elements 3a to 3f. The upper-side conductor foil 11b is electrically connected to the source electrode of the respective power semiconductor elements 3g to 3l via lead frames 6g to 6l.

The positive electrode terminal 81 is electrically connected to the upper-side conductor foil 11h. The upper-side conductor foil 11h is electrically connected to the drain electrode of the respective power semiconductor elements 3e to 3h. The negative electrode terminal 82 is electrically connected to the upper-side conductor foils 11a and 11e. The upper-side conductor foil 11a is electrically connected to the source electrode of the respective power semiconductor elements 3a to 3c via the lead frames 6a to 6c. The upper-side conductor foil 11e is electrically connected to the source electrode of the respective power semiconductor elements 3d to 3f via the lead frames 6d to 6f.

Figure 2:
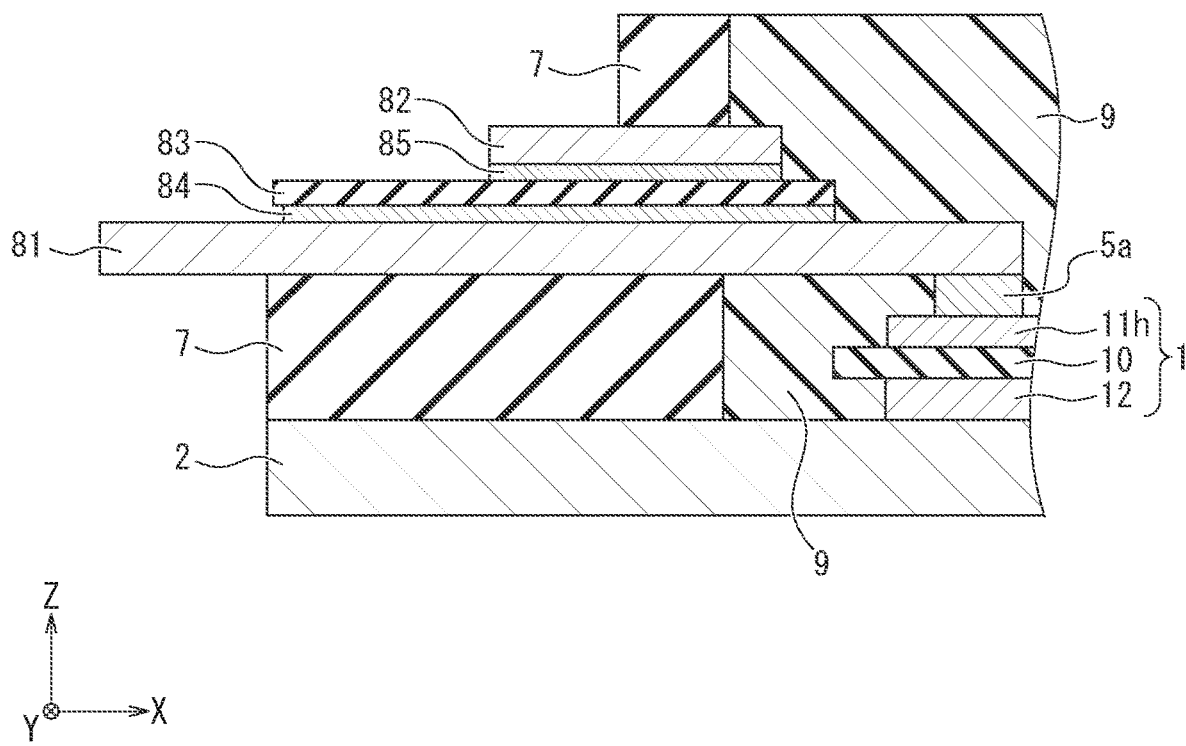
FIG. 2 is a cross-sectional view as viewed from direction A-A in FIG. 1.
Figure 3:
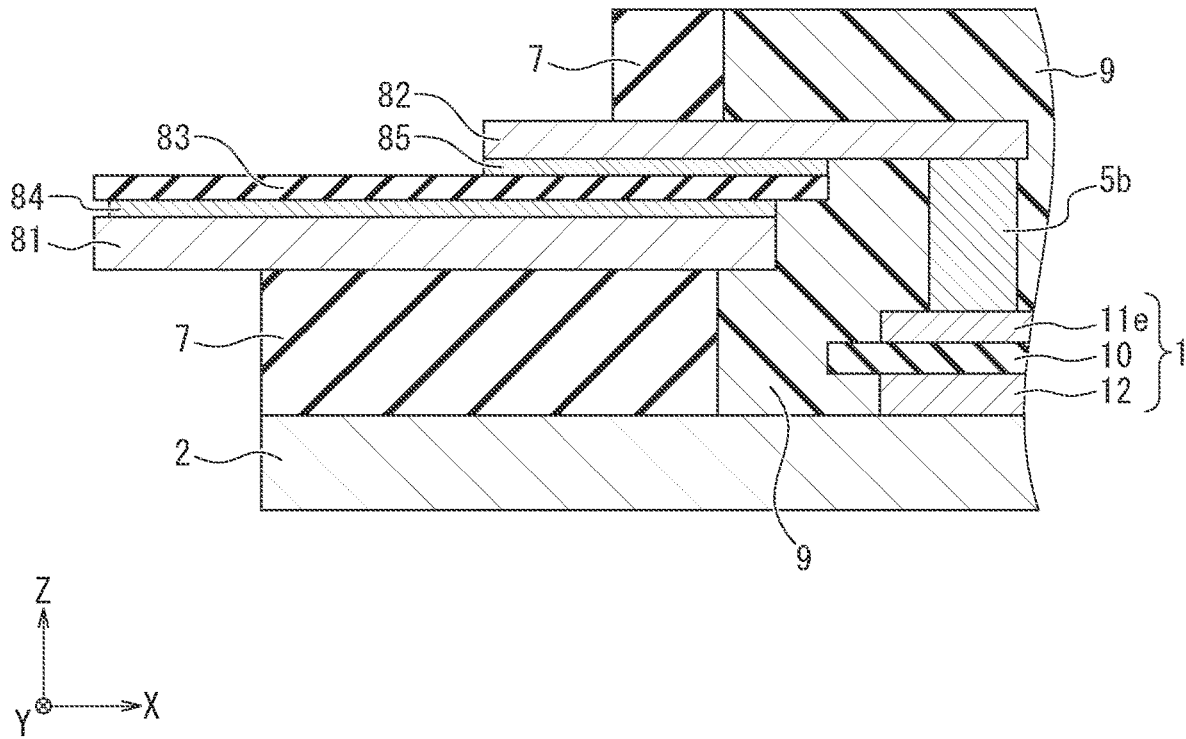
FIG. 3 is a cross-sectional view as viewed from direction B-B in FIG. 1.

FIG. 2 is a cross-sectional view as viewed from direction A-A passing through a laminated wiring structure of the positive electrode terminal 81 and the negative electrode terminal 82 illustrated in FIG. 1, and FIG. 3 is a cross-sectional view as viewed from direction B-B passing through the laminated wiring structure of the positive electrode terminal 81 and the negative electrode terminal 82 illustrated in FIG. 1.

As illustrated in FIG. 2 and FIG. 3, the insulated circuit substrate 1, the power semiconductor elements 3a to 3l, and the like inside the case 7 are sealed with a sealing material 9. The sealing material 9 to be used can be insulating sealing resin such as thermosetting silicone gel or epoxy resin. A cooling body (a base) 2 is arranged on the bottom surface side of the insulated circuit substrate 1. The cooling body 2 can be made from material having high heat conductivity, such as copper (Cu), aluminum (Al), composite material (AlSiC) of Al and silicon carbide, and composite material (MgSiC) of magnesium (Mg) and silicon carbide.

The positive electrode terminal 81 and the negative electrode terminal 82 each have a flat plate-like shape. The material used for the positive electrode terminal 81 and the negative electrode terminal 82 can be copper (Cu), a Cu alloy, aluminum (Al), or an aluminum alloy, for example. As illustrated in FIG. 2, the positive electrode terminal 81 is electrically connected to the upper-side conductor foil 11h via a spacer 5a made from copper (Cu) material, for example, used for height adjustment. As illustrated in FIG. 3, the negative electrode terminal 82 is electrically connected to the upper-side conductor foil 11e via a spacer 5b made from copper (Cu) material, for example, used for height adjustment. Since a distance between the negative electrode terminal 82 and the insulated circuit substrate 1 is greater than a distance between the positive electrode terminal 81 and the insulated circuit substrate 1, the height of the spacer 5b connected to the negative electrode terminal 82 is greater than the height of the spacer 5a connected to the positive electrode terminal 81.

As illustrated in FIG. 1 to FIG. 3, an insulating sheet 83 is arranged between the top surface (the main surface) of the positive electrode terminal 81 and the bottom surface (the main surface) of the negative electrode terminal 82. A conductive film (a positive electrode-side conductive film) 84 is arranged between the bottom surface of the insulating sheet 83 and the top surface of the positive electrode terminal 81. A conductive film (a negative electrode-side conductive film) 85 is arranged between the top surface of the insulating sheet 83 and the bottom surface of the negative electrode terminal 82.

The positive electrode terminal 81 and the negative electrode terminal 82 are protruded from the inside to the outside of the power semiconductor module in a state of being laminated interposing the insulating sheet 83, the positive electrode-side conductive film 84, and the negative electrode-side conductive film 85. The distance between the positive electrode terminal 81 and the negative electrode terminal 82 is constant to conform to the thickness of the insulating sheet 83, the positive electrode-side conductive film 84, and the negative electrode-side conductive film 85 from the inside to the outside of the power semiconductor module. This structure can achieve a reduction in wiring parasitic inductance, since a current flows through the positive electrode terminal 81 and the negative electrode terminal 82 in the opposite directions.

The insulating sheet 83 to be used can be an insulating paper or a sheet having high insulating properties and high heat resistance made from polyimide or polyamide. A thickness of the insulating sheet 83, which depends on a rated voltage of the power semiconductor module, is set to 0.1 millimeters or greater and 1.0 millimeters or smaller when the rated voltage is 1200 volts. Setting the thickness preferably to 0.2 millimeters or greater and 0.6 millimeters or smaller can greatly reduce the wiring inductance of the positive electrode terminal 81 and the negative electrode terminal 82.

A thickness of each of the positive electrode-side conductive film 84 and the negative electrode-side conductive film 85 can be set within a range of 0.1 micrometers or greater and 100 micrometers or smaller, for example. The positive electrode-side conductive film 84 and the negative electrode-side conductive film 85, if having a thickness that is too small, may cause a defect in film formation to lead the insulating film 83 to be exposed. The positive electrode-side conductive film 84 and the negative electrode-side conductive film 85, if having a thickness that is too large, may cause a warp due to a stress of the positive electrode-side conductive film 84 and the negative electrode-side conductive film 85 to cause cracks in the positive electrode-side conductive film 84 and the negative electrode-side conductive film 85 when stacked between the positive electrode terminal 81 and the negative electrode terminal 82 to return to be a flat state. In view of this, the thickness of the positive electrode-side conductive film 84 and the negative electrode-side conductive film 85 is adjusted as appropriate depending on the material used for the positive electrode-side conductive film 84 and the negative electrode-side conductive film 85. The positive electrode-side conductive film 84 and the negative electrode-side conductive film 85 may have the same thickness or may have different thicknesses.

The material used for the positive electrode-side conductive film 84 and the negative electrode-side conductive film 85 is only required to have conductivity, and is preferably a material having higher resistance to corrosion than the positive electrode terminal 81 and the negative electrode terminal 82. Examples of the material used for the positive electrode-side conductive film 84 and the negative electrode-side conductive film 85 include metal such as gold (Au), platinum (Pt), titanium (Ti), nickel (Ni), and chromium (Cr), conductive diamond-like carbon (DLC), and a conductive oxide film such as indium tin oxide (ITO). Alternatively, copper (Cu) or aluminum (Al) may be used as the material for the positive electrode-side conductive film 84 and the negative electrode-side conductive film 85. The positive electrode-side conductive film 84 and the negative electrode-side conductive film 85 may be made from either the same material or different materials. The material used for the positive electrode-side conductive film 84 and the negative electrode-side conductive film 85 may be either the same as or different from the material used for the positive electrode terminal 81 and the negative electrode terminal 82.

Figure 4:
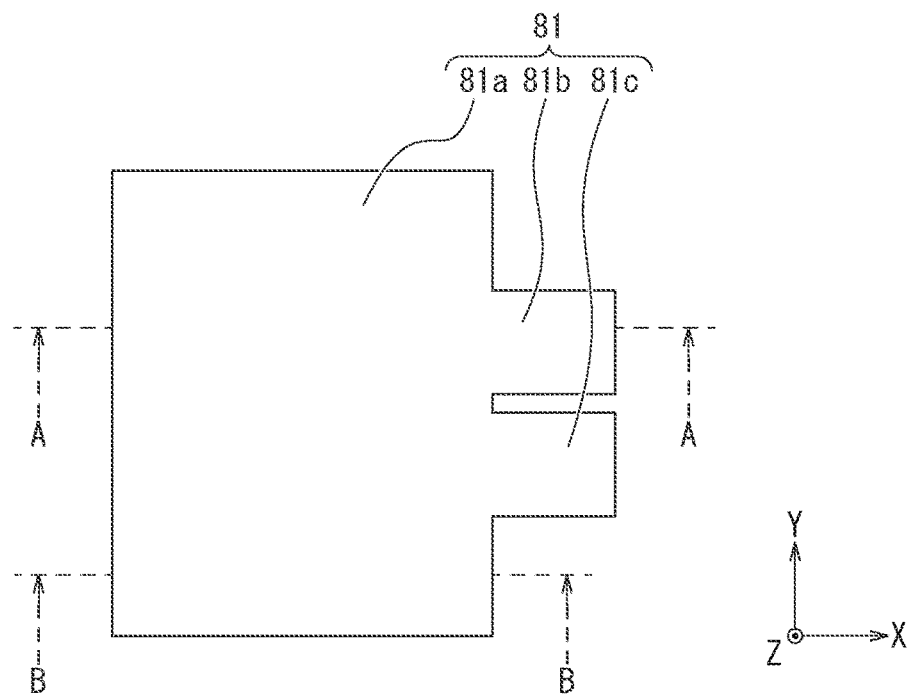
FIG. 4 is a plan view illustrating a positive electrode terminal of the semiconductor device according to the embodiment.

FIG. 4 illustrates a planar pattern of the positive electrode terminal 81. The positions of line A-A and line B-B in FIG. 4 correspond to the positions of line A-A and line B-B in FIG. 1. The positive electrode terminal 81 includes a rectangular body part 81a, and projections 81b and 81c projecting from the body part 81a in the planar pattern. The respective projections 81b and 81c are a part extending to the inside of the case 7 and electrically connected to the upper-side conductor foil 11h via the spacer 5a. The planar pattern of the positive electrode terminal 81 can be determined as appropriate, and is not limited to the shape as illustrated in FIG. 4.

Figure 5:
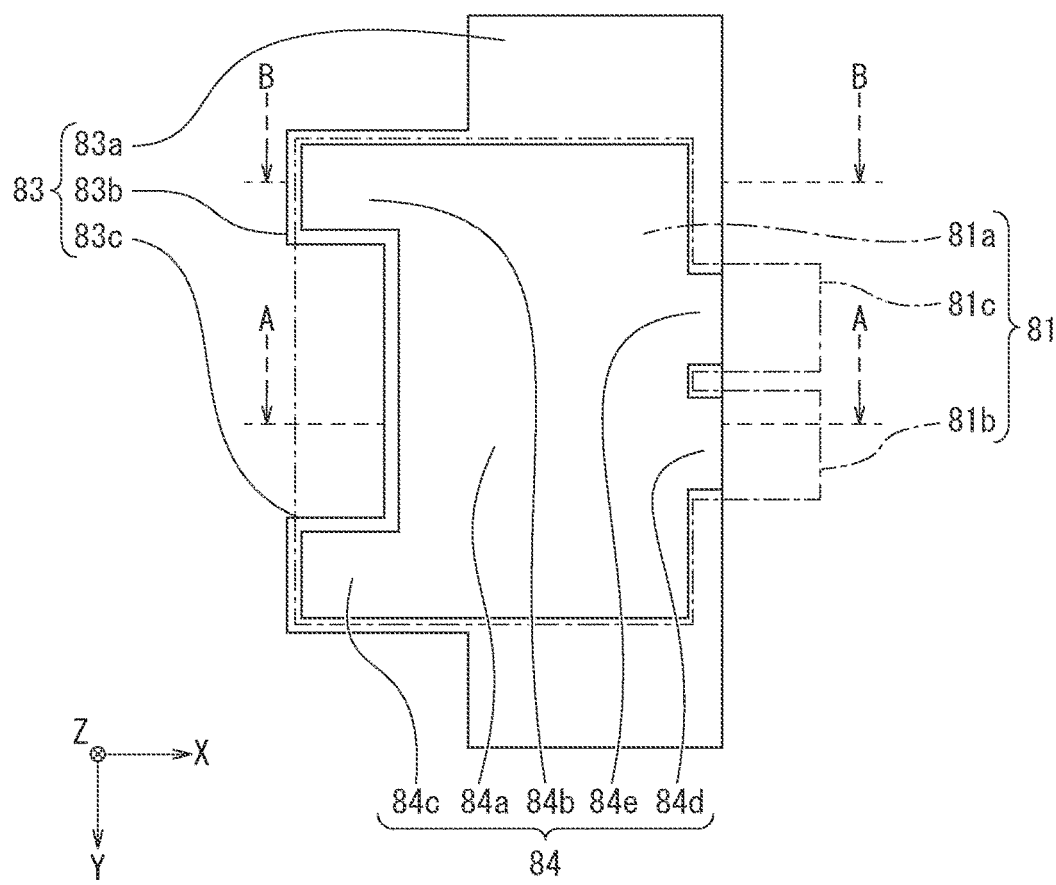
FIG. 5 is a plan view illustrating an insulating sheet and a positive electrode-side conductive film of the semiconductor device according to the embodiment as viewed from the positive electrode terminal side.

FIG. 5 illustrates the insulating sheet 83 and the positive electrode-side conductive film 84 as viewed from the positive electrode terminal 81 side, and schematically indicates the overlapping position of the positive electrode terminal 81 by the dash and dotted line. The positions of line A-A and line B-B in FIG. 5 correspond to the positions of line A-A and line B-B in FIG. 1. The planar pattern of the insulating sheet 83 has a shape corresponding to the planar pattern of the positive electrode terminal 81 and the negative electrode terminal 82. The outer edge (the end part) of the insulating sheet 83 has greater dimensions than the outer edge of each of the positive electrode terminal 81 and the negative electrode terminal 82 so as to ensure an insulation creepage distance necessary at the respective end parts of the positive electrode terminal 81 and the negative electrode terminal 82. The insulating sheet 83 includes a rectangular body part 83a, and projections 83b and 83c projecting from the body part 83a in the planar pattern.

The positive electrode-side conductive film 84 includes a rectangular body part 84a, projections 84b and 84c projecting from the body part 84a, and projections 84d and 84e projecting on the opposite side of the projections 84b and 84c. The projections 84b and 84c of the positive electrode-side conductive film 84 overlap with the projections 83b and 83c of the insulating sheet 83. The projections 84d and 84e of the positive electrode-side conductive film 84 overlap with the projections 81b and 81c of the positive electrode terminal 81.

The outer edge of the positive electrode-side conductive film 84 is either smaller than or conforms to the outer edge of the opposed part between the insulating sheet 83 and the positive electrode terminal 81 in the planar pattern. The outer edge of the positive electrode-side conductive film 84 either conforms to the outer edge of the insulating sheet 83 or is located inside the outer edge of the insulating sheet 83. The outer edge of the positive electrode-side conductive film 84 either conforms to the outer edge of the positive electrode terminal 81 or is located inside the outer edge of the positive electrode terminal 81 so as not to protrude to the outside of the positive electrode terminal 81. This structure can prevent an electric-field concentration of the positive electrode-side conductive film 84 caused if protruding to the outside of the positive electrode terminal 81, and can also prevent deterioration or damage of the insulating sheet 83.

Figure 6:
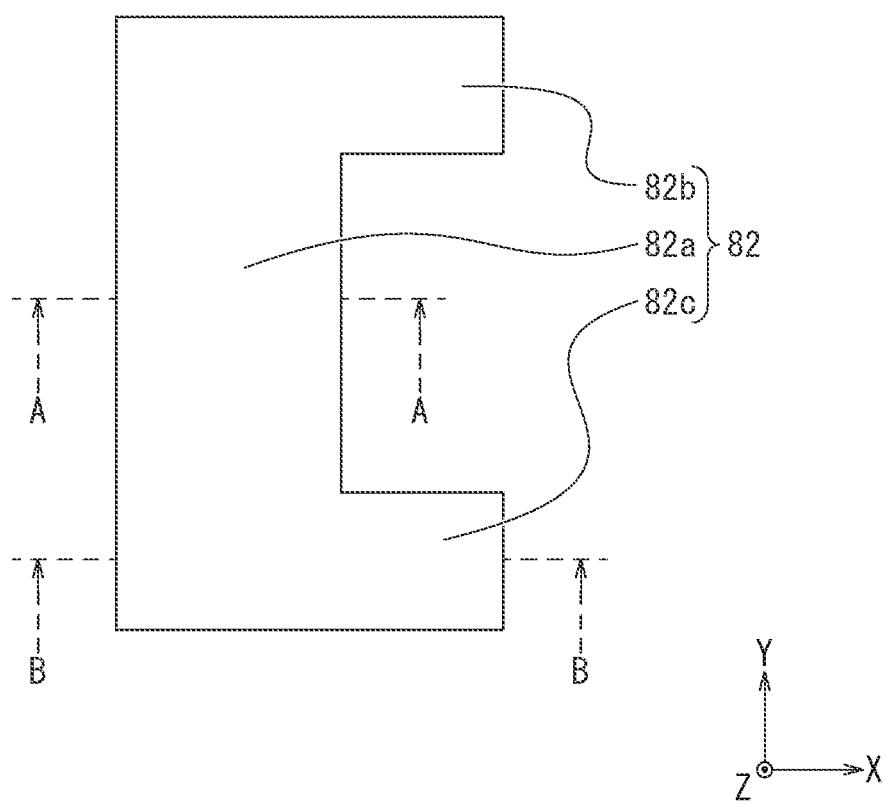
FIG. 6 is a plan view illustrating a negative electrode terminal of the semiconductor device according to the embodiment.

FIG. 6 illustrates a planar pattern of the negative electrode terminal 82. The positions of line A-A and line B-B in FIG. 6 correspond to the positions of line A-A and line B-B in FIG. 1. The negative electrode terminal 82 includes a rectangular body part 82a, and projections 82b and 82c projecting from the body part 82a in the planar pattern. The respective projections 82b and 82c are a part extending to the inside of the case 7 and electrically connected to the upper-side conductor foil 11e via the spacer 5b. The planar pattern of the negative electrode terminal 82 can be determined as appropriate, and is not limited to the shape as illustrated in FIG. 6.

Figure 7:
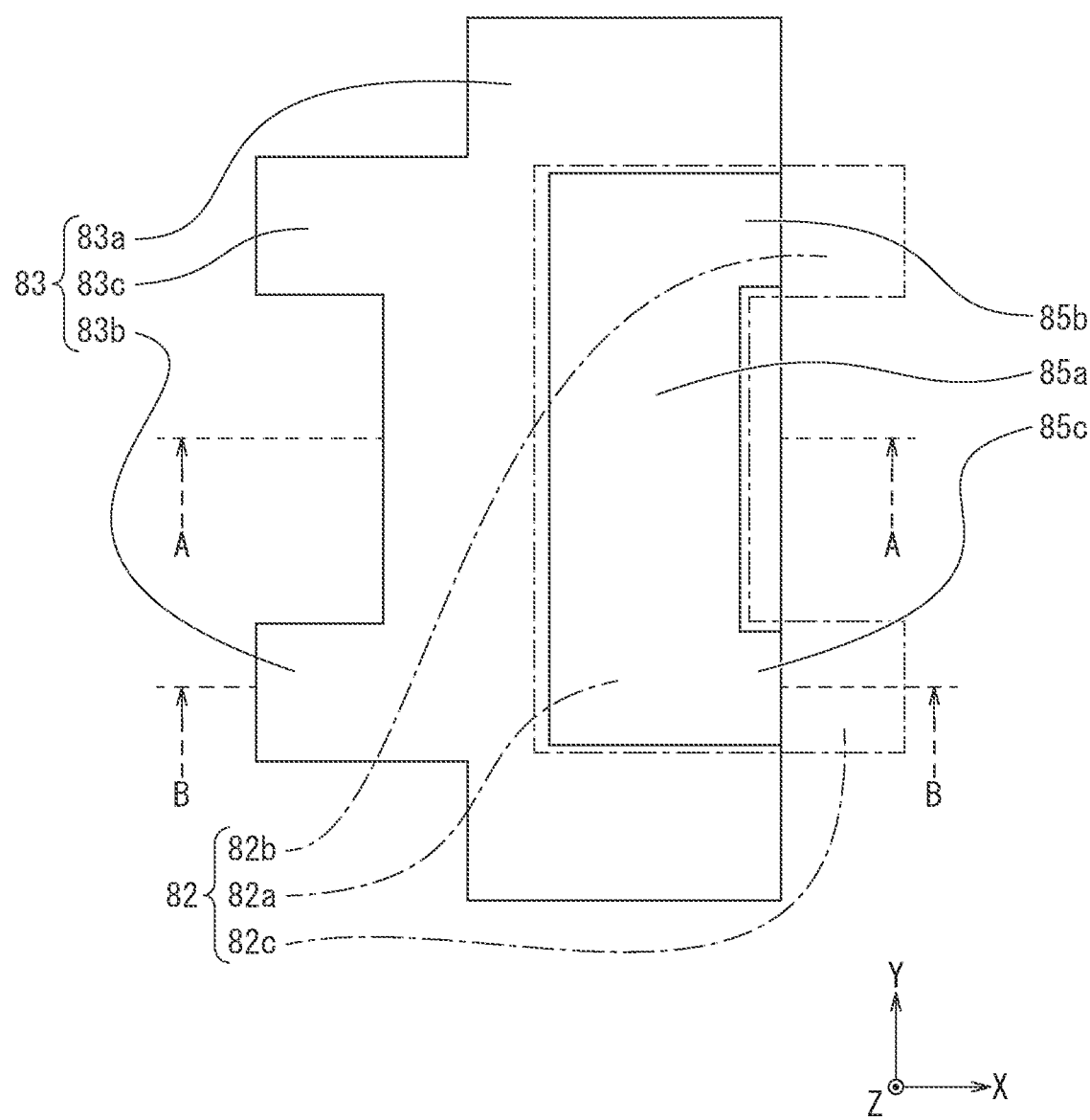
FIG. 7 is a plan view illustrating the insulating sheet and a negative electrode-side conductive film of the semiconductor device according to the embodiment as viewed from the negative electrode terminal side.

FIG. 7 illustrates the insulating sheet 83 and the negative electrode-side conductive film 85 as viewed from the negative electrode terminal 82 side, and schematically indicates the overlapping position of the negative electrode terminal 82 by the dash and dotted line. The positions of line A-A and line B-B in FIG. 7 correspond to the positions of line A-A and line B-B in FIG. 1. The negative electrode-side conductive film 85 includes a substantially rectangular body part 85a, and projections 85b and 85c projecting from the body part 85a in the planar pattern. The projections 85b and 85c of the negative electrode-side conductive film 85 overlap with the projections 82b and 82c of the negative electrode terminal 82.

The outer edge of the negative electrode-side conductive film 85 is either smaller than or conforms to the outer edge of the opposed part between the insulating sheet 83 and the negative electrode terminal 82 in the planar pattern. The outer edge of the negative electrode-side conductive film 85 either conforms to the outer edge of the insulating sheet 83 or is located inside the outer edge of the insulating sheet 83. The outer edge of the negative electrode-side conductive film 85 either conforms to the outer edge of the negative electrode terminal 82 or is located inside the outer edge of the negative electrode terminal 82 so as not to protrude to the outside of the negative electrode terminal 82. This structure can prevent an electric-field concentration of the negative electrode-side conductive film 85 caused if protruding to the outside of the negative electrode terminal 82, and also can prevent deterioration or damage of the insulating sheet 83.

The positive electrode-side conductive film 84 and the negative electrode-side conductive film 85 are in direct contact with the positive electrode terminal 81 and the negative electrode terminal 82 respectively without being bonded together via an adhesive or the like. The direct contact can avoid a defect derived from expansion of voids remaining in the adhesive upon heating molding, which can be caused in the case of the bonding by use of the adhesive.

The positive electrode terminal 81 and the positive electrode-side conductive film 84 have the same potential when being in contact with each other at least at a single point. The negative electrode terminal 82 and the negative electrode-side conductive film 85 have the same potential when being in contact with each other at least at a single point. This can avoid partial discharge if a gap is caused between the positive electrode-side conductive film 84 and the positive electrode terminal 81 or between the negative electrode-side conductive film 85 and the negative electrode terminal 82, so as to achieve the lamination wiring with high insulating properties.

Figure 8:
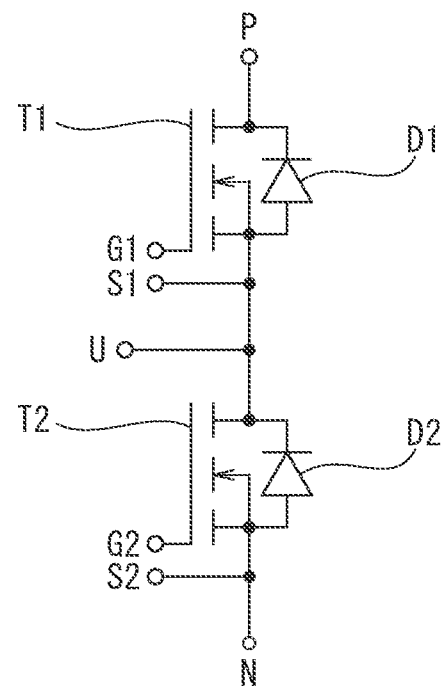
FIG. 8 is a circuit diagram of the semiconductor device according to the embodiment.

FIG. 8 illustrates an equivalent circuit diagram of the semiconductor device according to the embodiment as illustrated in FIG. 1 to FIG. 7. As illustrated in FIG. 8, the semiconductor device according to the embodiment implements a part of a three-phase bridge circuit. A drain electrode of a transistor T1 on the upper arm side is connected to a positive electrode terminal P, and a source electrode of a transistor T2 on the lower arm side is connected to a negative electrode terminal N. A source electrode of the transistor T1 and a drain electrode of the transistor T2 are connected to an output terminal U and an auxiliary source terminal S1. An auxiliary source terminal S2 is connected to the source electrode of the transistor T2. Gate control terminals G1 and G2 are connected to gate electrodes of the respective transistors T1 and T2. Body diodes D1 and D2, which are free-wheeling diodes (FWD), are housed and connected in antiparallel to the transistors T1 and T2.

The output terminal U, the positive electrode terminal P, and the negative electrode terminal N illustrated in FIG. 8 correspond to the output terminal 80, the positive electrode terminal 81, and the negative electrode terminal 82 illustrated in FIG. 1. The transistor T1 and the body diode D1 illustrated in FIG. 8 correspond to the power semiconductor elements 3a to 3f illustrated in FIG. 1. The transistor T2 and the body diode D2 illustrated in FIG. 8 correspond to the power semiconductor elements 3g to 3l illustrated in FIG. 1. The gate control terminals G1 and G2 illustrated in FIG. 8 correspond to the control terminals 7d and 7h illustrated in FIG. 1, and the auxiliary source terminals S1 and S2 illustrated in FIG. 8 correspond to the control terminals 7c and 7g illustrated in FIG. 1.

The structure of the semiconductor device according to the embodiment including the positive electrode terminal 81 and the negative electrode terminal 82 of the power semiconductor module laminated together via the insulating sheet 83, decreases the distance between the positive electrode terminal 81 and the negative electrode terminal 82, so as to reduce the wiring parasitic inductance. In addition, the arrangement of the positive electrode-side conductive film 84 and the negative electrode-side conductive film 85 on the bottom surface and the top surface of the insulating sheet 83 can avoid partial discharge between the positive electrode terminal 81 and the negative electrode terminal 82. This configuration can improve the reliability of the product and reduce a switching loss.

<Method of Manufacturing Semiconductor Device>

An example of a method of manufacturing the semiconductor device according to the embodiment is described below with reference to FIG. 1 to FIG. 7. The lower-side conductor foil 12 of the insulated circuit substrate 1 illustrated in FIG. 2 and FIG. 3 is bonded to the cooling body 2 by use of bonding material such as solder or sintered material. The power semiconductor elements 3a to 3l are bonded to the upper-side conductor foils 11b and 11h of the insulated circuit substrate 1 illustrated in FIG. 1 by use of bonding material such as solder or sintered material. The cooling body 2 or the lower-side conductor foil 12 of the insulated circuit substrate 1 is subjected to plating treatment of nickel (Ni)—phosphorus (P) or gold (Au), for example, as necessary, so as to improve the bonding performance. The resin insulating layer, when used as the insulating substrate 10 of the insulated circuit substrate 1, is provided on the surface of the cooling body 2, and the upper-side conductor foils 11a to 11j are further provided on the surface of the resin insulating layer. The direct bonding between the resin insulating layer and the cooling body 2 and the direct bonding between the resin insulating layer and the respective upper-side conductor foils 11a to 11j can reduce heat resistance so as to efficiently release heat generated in the power semiconductor elements 3a to 3l.

Next, the source electrode on the surface of the respective power semiconductor elements 3a to 3l and the respective upper-side conductor foils 11a, 11b, and 11e are electrically connected to each other by use of the lead frames 6a to 6l of copper (Cu) or aluminum (Al) via bonding material such as solder or sintered material. This electrical connection may be executed by ultrasonic bonding by use of wires or ribbons, for example. The control electrodes on the surfaces of the power semiconductor elements 3a to 3l, which have a small current capacity, are electrically connected to the upper-side conductor foils 11g and 11j by wire bonding of aluminum (Al), for example.

Next, the insulating sheet 83 is prepared and formed into a shape conforming to the shape of the positive electrode terminal 81 and the negative electrode terminal 82 by use of a metal die. The positive electrode-side conductive film 84 and the negative electrode-side conductive film 85 are then formed on the surface of the insulating sheet 83. A method of forming the positive electrode-side conductive film 84 and the negative electrode-side conductive film 85 on the insulating sheet 83 can be a vacuum process such as a vacuum deposition method, a sputtering method, a chemical vapor deposition (CVD) method, and an atomic layer deposition (ALD) method, so as to form the positive electrode-side conductive film 84 and the negative electrode-side conductive film 85 in a vacuum. The use of the vacuum process can avoid a provision of a space that could cause partial discharge between the insulating sheet 83 and each of the positive electrode-side conductive film 84 and the negative electrode-side conductive film 85.

A metal mask or the like can be used for forming the pattern of the positive electrode-side conductive film 84 and the negative electrode-side conductive film 85. Since the positive electrode-side conductive film 84 and the negative electrode-side conductive film 85 each only need to have an area that is slightly smaller than the surface on which each of the positive electrode terminal 81 and the negative electrode terminal 82 is opposed to the insulating sheet 83, and are not required to have a high dimensional accuracy, the use of a low-cost metal mask is preferable in this case. In addition, the process of heating the positive electrode-side conductive film 84 and the negative electrode-side conductive film 85 when formed on the insulating sheet 83 can prevent separation of the positive electrode-side conductive film 84 and the negative electrode-side conductive film 85 from the insulating sheet 83. The insulating sheet 83 is thus preferably made from material having high heat resistance.

The positive electrode terminal 81 and the negative electrode terminal 82 are each formed from a copper (Cu) plate or the like punched by use of a metal die. The positive electrode terminal 81 and the negative electrode terminal 82 can be preliminarily plated with nickel (Ni)—phosphorus (P) or gold (Au) as necessary. The insulating sheet 83 provided with the positive electrode-side conductive film 84 and the negative electrode-side conductive film 85 is then interposed to be stacked between the positive electrode terminal 81 and the negative electrode terminal 82 and is attached to a molding metal die, and the output terminal 80 and the control terminals 7a to 7i are also attached to the molding metal die. The case 7 in which the positive electrode terminal 81, the negative electrode terminal 82, the output terminal 80, and the control terminals 7a to 7i are inserted is formed from resin material so as to integrate the positive electrode terminal 81, the negative electrode terminal 82, the output terminal 80, and the control terminals 7a to 7i with the case 7.

Since the positive electrode terminal 81, the insulating sheet 83 provided with the positive electrode-side conductive film 84 and the negative electrode-side conductive film 85, and the negative electrode terminal 82 are not bonded to each other via an adhesive, a defect derived from expansion of remaining voids upon heating molding can be avoided. The positive electrode terminal 81 and the negative electrode terminal 82, when being in contact with the positive electrode-side conductive film 84 and the negative electrode-side conductive film 85 formed on the insulating sheet 83 each at least at a single point, have the same potential respectively as the positive electrode-side conductive film 84 and the negative electrode-side conductive film 85. This can avoid partial discharge if a gap is caused between each of the positive electrode terminal 81 and the negative electrode terminal 82 and each of the positive electrode-side conductive film 84 and the negative electrode-side conductive film 85, so as to ensure a laminated wiring structure having high insulating properties.

Next, the case 7 in which the positive electrode terminal 81, the negative electrode terminal 82, the output terminal 80, and the like are inserted is bonded to the cooling body 2 so as to surround the insulated circuit substrate 1 and the respective power semiconductor elements 3a to 3l. The positive electrode terminal 81, the negative electrode terminal 82, and the output terminal 80 are bonded to the upper-side conductor foils 11a, 11b, 11e, and 11h via the spacers 5a and 5b and the like. These members can be bonded together by use of bonding material such as solder or sintered material, or may be directly bonded together by laser welding, for example. The control terminals 7c, 7d, 7g, and 7h are electrically connected to the upper-side conductor foils 11f, 11g, 11i, and 11j by wire bonding.

Next, the region surrounded by the cooling body 2 and the case 7 is sealed with (potted in) the sealing material 9 such as sealing resin so as to protect the insulated circuit substrate 1, the power semiconductor elements 3a to 3, and the like. The sealing resin is preferably preliminarily subjected to defoaming. The potting executed under a decompression atmosphere can avoid a generation of voids. The epoxy resin, which sometimes has high viscosity at normal temperature, is heated to a temperature as high as possible but lower than a temperature at which cross linking starts so as to reduce the viscosity, and is subjected to defoaming and potting, and the case 7 is then heated to the temperature or higher at which the cross linking starts, so as to avoid a generation of voids in the sealing material 9.

The method of manufacturing the semiconductor device can manufacture a power semiconductor module having high reliability of insulation while a reduction in wiring inductance is achieved. The connection of the positive electrode terminal 81 and the negative electrode terminal 82 to an external power supply device or a DC power wire can be achieved with a wire laminated with the insulating sheet 83 by laser welding, for example.

<Modified Example>

Figure 9:
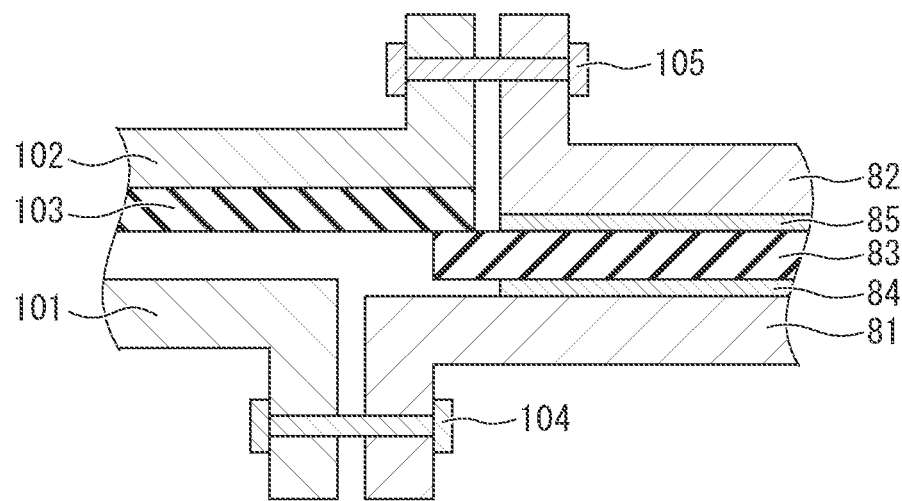
FIG. 9 is a cross-sectional view illustrating a part of a semiconductor device according to a modified example of the embodiment.

A semiconductor device according to a modified example of the embodiment differs from the semiconductor device according to the embodiment illustrated in FIG. 2 and FIG. 3 in the structure at the outer end part of the laminated wiring structure of the positive electrode terminal 81 and the negative electrode terminal 82, as illustrated in FIG. 9. The insulating sheet 83 is interposed between the positive electrode terminal 81 and the negative electrode terminal 82, as illustrated in FIG. 9. The positive electrode-side conductive film 84 is deposited on the positive electrode terminal 81 side of the insulating sheet 83, and the negative electrode-side conductive film 85 is deposited on the negative electrode terminal 82 side of the insulating sheet 83.

The positive electrode terminal 81 and the negative electrode terminal 82 are electrically connected to connection terminals 101 and 102 on the capacitor side (not illustrated). The end part of the positive electrode terminal 81 is bent into an L-shape and is provided with a bolt hole, and a fastening part 104 composed of a bolt and a nut is inserted to the bolt hole so that the positive electrode terminal 81 is fixed together with the connection terminal 101 on the capacitor side. The end part of the negative electrode terminal 82 is bent into an L-shape and is provided with a bolt hole, and a fastening part 105 composed of a bolt and a nut is inserted to the bolt hole so that the negative electrode terminal 82 is fixed together with the connection terminal 102 on the capacitor side.

An insulating sheet 103 on the capacitor side is interposed between the connection terminal 101 and the connection terminal 102 on the capacitor side. The end part of the insulating sheet 103 on the capacitor side is arranged to overlap with the end part of the insulating sheet 83.

Other Embodiments

As described above, the invention has been described according to the embodiment, but it should not be understood that the description and drawings implementing a portion of this disclosure limit the invention. Various alternative embodiments of the present invention, examples, and operational techniques will be apparent to those skilled in the art from this disclosure.

While the embodiment has been illustrated above with the case in which the positive electrode-side conductive film 84 and the negative electrode-side conductive film 85 are arranged on both the bottom surface and the top surface of the insulating sheet 83, as illustrated in FIG. 1 to FIG. 3, at least one of the positive electrode-side conductive film 84 and the negative electrode-side conductive film 85 may be arranged on the bottom surface or the top surface of the insulating sheet 83. Namely, the positive electrode-side conductive film 84 may be arranged on the bottom surface of the insulating sheet 83, while the arrangement of the negative electrode-side conductive film 85 on the top surface of the insulating sheet 83 is omitted. Alternatively, the negative electrode-side conductive film 85 may be arranged on the top surface of the insulating sheet 83, while the arrangement of the positive electrode-side conductive film 84 on the bottom surface of the insulating sheet 83 is omitted.

While the embodiment has been illustrated above with the laminated wiring structure in which the positive electrode terminal 81 is located on the lower side and the negative electrode terminal 82 is located on the upper side, as illustrated in FIG. 1 to FIG. 3, the positional relation between the positive electrode terminal 81 and the negative electrode terminal 82 can be reversed so as to have a laminated wiring structure in which the positive electrode terminal 81 is located on the upper side and the negative electrode terminal 82 is located on the lower side.

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor device comprising:
an insulated circuit substrate;
a power semiconductor element mounted on the insulated circuit substrate;
a first terminal having a plate-like shape having a first main surface and electrically connected to the power semiconductor element;
a second terminal having a second main surface opposed to the first main surface of the first terminal and electrically connected to the power semiconductor element;
an insulating sheet interposed between the first main surface and the second main surface;
a conductive film provided on at least one of between the insulating sheet and the first main surface and between the insulating sheet and the second main surface; and
a case to which the first terminal and the second terminal are attached, the case surrounding the insulated circuit substrate and the power semiconductor element,
wherein a laminated wiring structure configured by laminating the first terminal, the second terminal, the insulating sheet and the conductive film with each other are provided from inside to outside of the case.

2. The semiconductor device of claim 1, wherein the conductive film is made from a material having higher corrosion resistance than the first terminal and the second terminal.

3. The semiconductor device of claim 1, wherein an outer edge of the conductive film conforms to an outer edge of the insulating sheet or is located inside the outer edge of the insulating sheet.

4. The semiconductor device of claim 1, wherein:
the conductive film is arranged between the insulating sheet and the first main surface; and
an outer edge of the conductive film conforms to an outer edge of a part opposed to the insulating sheet of the first main surface or is located inside the outer edge of the part opposed to the insulating sheet of the first main surface.

5. The semiconductor device of claim 1, wherein:
the first terminal is a positive electrode terminal; and
the second terminal is a negative electrode terminal.

6. The semiconductor device of claim 1, wherein the conductive film is arranged between the insulating sheet and the first main surface, and in direct contact with the first terminal.

7. The semiconductor device of claim 1, wherein a thickness of the insulating sheet being 0.2 millimeters or greater and 0.6 millimeters or smaller.

* * * * *